United States Patent
Oda

(10) Patent No.: US 8,564,090 B2
(45) Date of Patent: Oct. 22, 2013

(54) SEMICONDUCTOR DEVICE AND METHOD OF MANUFACTURING SEMICONDUCTOR DEVICE

(75) Inventor: Noriaki Oda, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 369 days.

(21) Appl. No.: 12/963,695

(22) Filed: Dec. 9, 2010

(65) Prior Publication Data

US 2011/0140235 A1 Jun. 16, 2011

(30) Foreign Application Priority Data

Dec. 10, 2009 (JP) .................................. 2009-280474

(51) Int. Cl.
*H01L 23/52* (2006.01)

(52) U.S. Cl.
USPC ............... 257/529; 438/601; 257/E23.149

(58) Field of Classification Search
USPC ............... 257/529, 659, 660, 662, E23.149, 257/E21.592; 438/601, 132, 215, 281
See application file for complete search history.

(56) References Cited

U.S. PATENT DOCUMENTS

| 2007/0210414 A1* | 9/2007 | Iwamoto et al. ............... 257/529 |
| 2007/0280012 A1* | 12/2007 | Obayashi et al. ............. 365/200 |

FOREIGN PATENT DOCUMENTS

| JP | 11-097542 | 4/1999 |
| JP | 2002-197884 | 7/2002 |
| JP | 2004-193431 | 7/2004 |

* cited by examiner

*Primary Examiner* — Phat X Cao
*Assistant Examiner* — Nga Doan
(74) *Attorney, Agent, or Firm* — Young & Thompson

(57) ABSTRACT

A semiconductor device include an insulating interlayer formed over a substrate; an electrical fuse which is composed of a first wiring formed in the insulating interlayer, and has a cutting portion; and a second wiring and a third wiring, formed respectively on both sides of the cutting portion to extend along the cutting portion in the same layer as the first wiring. Air gaps formed to extend along the cutting portion are respectively provided between the cutting portion and the second wiring and between the cutting portion and the third wiring.

10 Claims, 11 Drawing Sheets

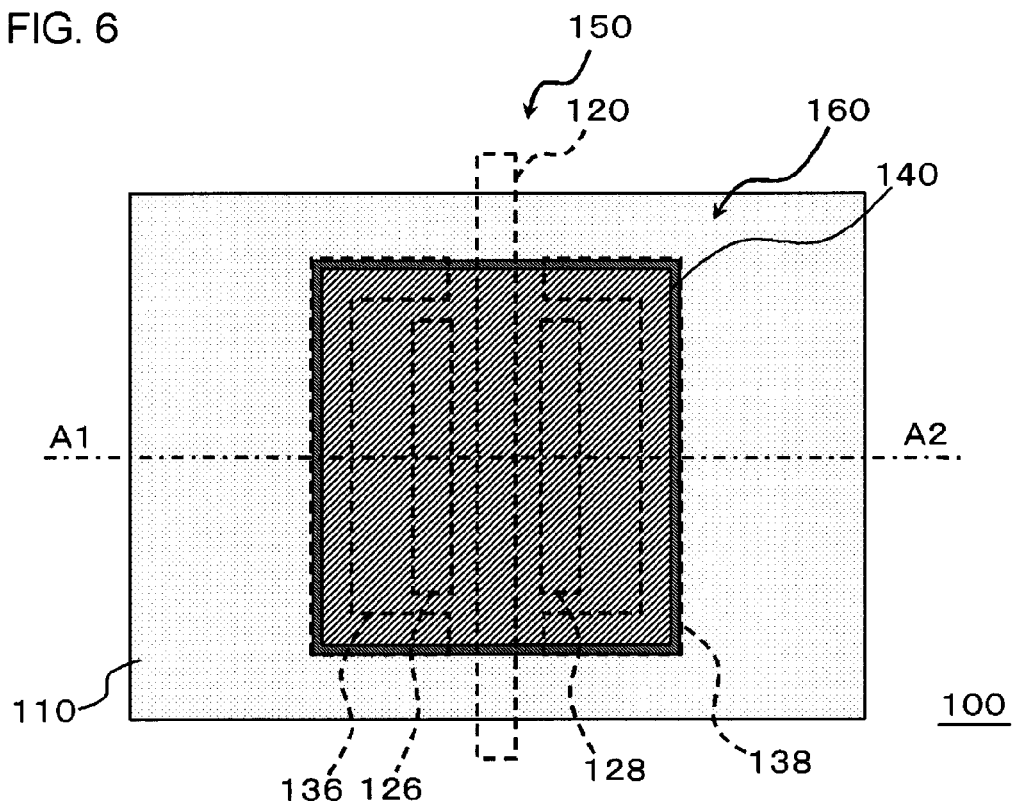

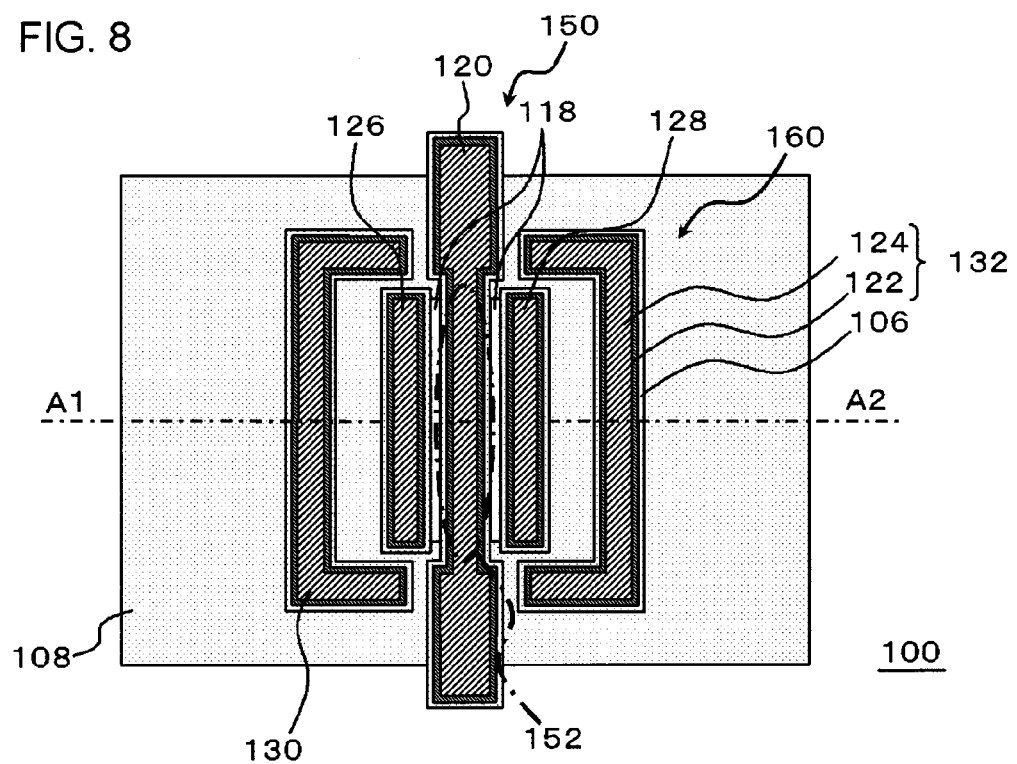

SEMICONDUCTOR DEVICE AND METHOD OF MANUFACTURING SEMICONDUCTOR DEVICE

This application is based on Japanese patent application No. 2009-280474, the content of which is incorporated hereinto by reference.

BACKGROUND

1. Technical Field

The present invention relates to a semiconductor device and a method of manufacturing the semiconductor device, and particularly to a semiconductor device including an electrical fuse and a method of manufacturing the semiconductor device.

2. Related Art

Hitherto, in semiconductor devices having a multilayer wiring structure in which a wiring and an insulating interlayer are used, the interconnect is buried in the inside of a groove provided in the insulating interlayer. The interconnect having such a wiring structure can be used as a fuse.

As one method of cutting the fuse, there is a method of irradiating a cutting portion of the fuse with a laser. Japanese Unexamined Patent Publication No. H11-97542 discloses a configuration in which the fuse is cut by laser irradiation. Here, as shown in FIGS. 10A and 10B, a lower metal wiring 2 and an upper metal wiring 4 are electrically connected to each other by a metal plug 5. A metal wiring 6 is provided to both sides of the upper metal wiring 4 in parallel with the upper metal wiring 4. An insulating interlayer 7 is formed on an insulating interlayer 3, the upper metal wiring 4, and the metal wiring 6, and a void 8 is provided in the insulating interlayer 7. A passivation film 9 is formed on the insulating interlayer 7.

In such a fuse structure, there is performed irradiation with laser light which is not absorbed in the passivation film 9, and is absorbed when the laser light reaches the upper metal wiring 4 made of aluminum. Thereby, the temperature of the aluminum rises, the aluminum evaporates explosively, the insulating interlayer 7 of the lateral face of the upper metal wiring 4 is blown off, and the lower metal wiring 2 and the upper metal wiring 4 are electrically isolated from each other due to the nonexistence of aluminum on the metal plug 5 (FIGS. 11A and 11B). Thereby, since the passivation film 9 exists in any of states before and after cutting of the fuse, moisture is not infiltrated into the insulating interlayer 7 formed of a fluoridated silicon oxide film having high hygroscopicity, and thus a problem in reliability does not occur. Here, the void 8 is provided in order to prevent aluminum evaporated during cutting from being deposited again. That is, the void 8 serves as a shelter of aluminum evaporated during cutting, and thus it is possible to prevent aluminum from being deposited again.

However, in the method of cutting the fuse with a laser, it is difficult to narrow down the cutting location. For this reason, an electrical fuse for melting down the fuse using a current is developed. For example, Japanese Unexamined Patent Publication No. 2002-197884 discloses a configuration in which for the purpose of easily melting down the electrical fuse using a current, a portion of a metal layer forming the electrical fuse is narrowed, or is formed in a shape which is once bent at a right angle, to thereby cause a current to be focused on a bent portion.

Meanwhile, Japanese Unexamined Patent Publication No. 2004-193431 discloses a configuration in which the air gaps are provided in order to lower a capacity between the wirings.

SUMMARY

An impact to such an extent that the aluminum evaporates explosively by laser light does not occur in the electrical fuse which is melt down by a current, like the fuse disclosed in Japanese Unexamined Patent Publication No. H11-97542. For this reason, it is not necessary to provide a void serving as a shelter of the aluminum evaporated during cutting. However, on the other hand, when the electrical fuse is melt down by a current, it is necessary to cause the electrical fuse to generate heat effectively for generating electromigration easily. Especially, when the electrical fuse is formed of, for example, a material having a strong electromigration resistance such as copper, there is a problem that cutting is difficult to occur.

In one embodiment, there is provided a semiconductor device including: a substrate; an insulating interlayer formed over the substrate, an electrical fuse which is composed of a first wiring formed in the insulating interlayer, and has a cutting portion; and a second wiring and a third wiring, formed respectively on both sides of the cutting portion to extend along the cutting portion in the same layer as the first wiring, wherein air gaps formed to extend along the cutting portion are respectively provided between the cutting portion and the second wiring and between the cutting portion and the third wiring.

In another embodiment, there is provided a method of manufacturing the above-mentioned semiconductor device, including cutting the cutting portion by causing a current to flow into the electrical fuse.

In still another embodiment, there is provided a method of manufacturing the above-mentioned semiconductor device, including: forming a first insulating interlayer over the substrate; forming the first wiring, the second wiring, and the third wiring by forming an wiring groove in the first insulating interlayer, burying a metal material within the wiring groove, and removing the metal material exposed to the outside of the wiring groove; forming spaces between the first wiring and the second wiring and between the first wiring and the third wiring by removing the first insulating interlayer through etching; and forming a second insulating interlayer over the substrate on the condition that the second insulating interlayer is not buried between the first wiring and the second wiring and between the first wiring and the third wiring, to form the air gaps.

According to such a configuration, an insulating interlayer does not exist in both sides of the cutting portion of the electrical fuse, and the air gaps having a lower thermal conductivity than the insulating interlayer are provided therein. For this reason, when the electrical fuse is cut by causing a current to flow into the electrical fuse, the air gaps function as a heat blocking region. Thereby, it is possible to reduce heat dissipation from the cutting portion, to cause the cutting portion to effectively generate heat, and to easily perform the meltdown of the electrical fuse.

Meanwhile, arbitrary combinations of the above-mentioned components, and ones obtained by conversion of the expression of the invention among methods, devices and the like are also effective as an aspect of the invention.

According to the invention, it is possible to easily cut the electrical fuse by increasing the heat generation of the cutting portion when a current is caused to flow into the electrical fuse.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a plan view illustrating the configuration of the semiconductor device shown in FIG. 4.

FIG. 8 is a plan cross-sectional view illustrating another example of the configuration of the semiconductor device according to the embodiment of the invention.

DETAILED DESCRIPTION

Figure 1A:
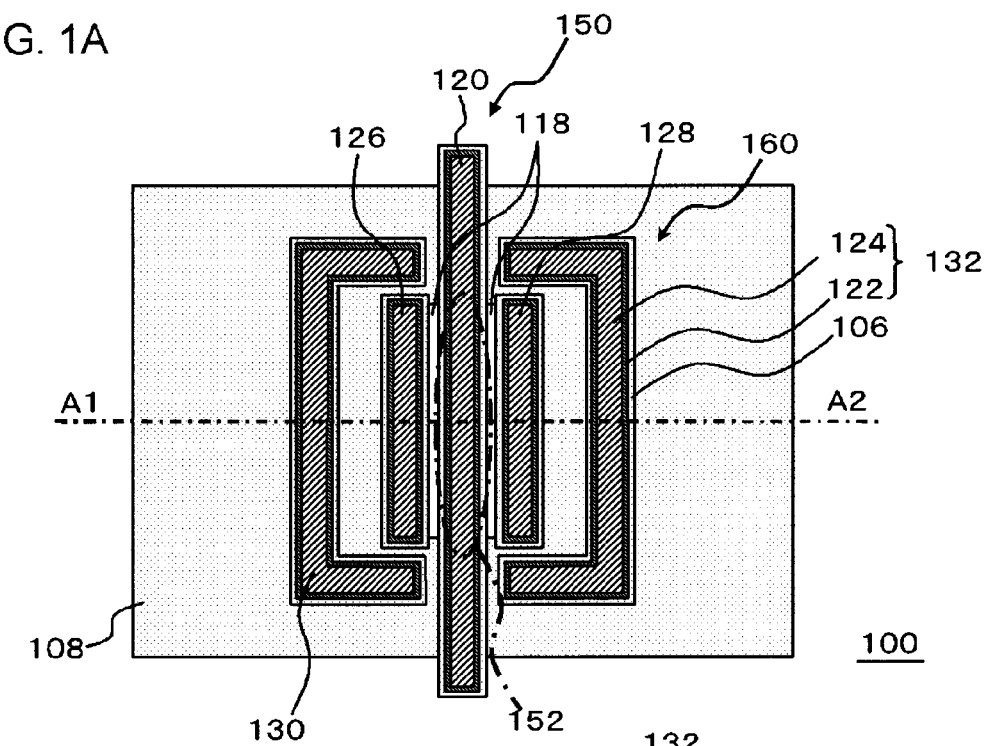
FIGS. 1A and 1B are diagrams illustrating an example of a configuration of a semiconductor device according to an embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

Figure 1B:
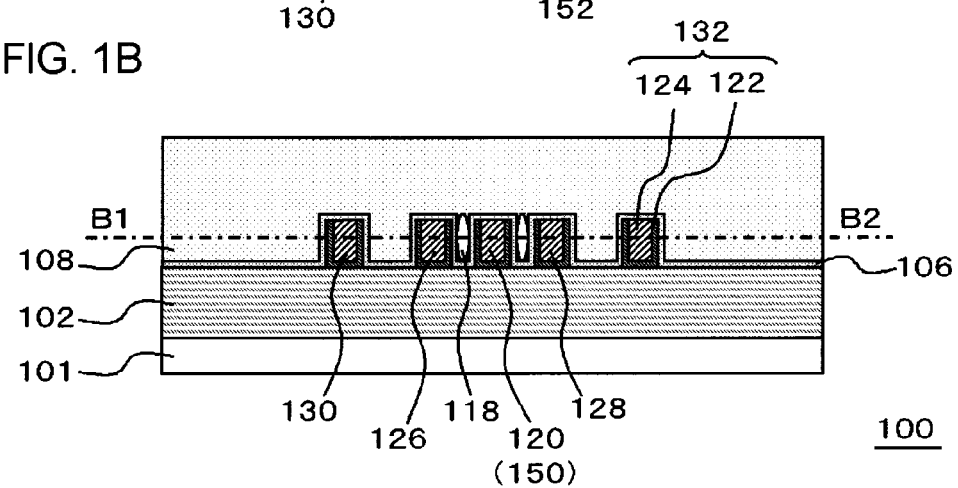

FIGS. 1A and 1B are diagrams illustrating an example of a configuration of a semiconductor device according to the embodiment. FIG. 1A is a plan cross-sectional view of a semiconductor device 100, and FIG. 1B is a cross-sectional view of the semiconductor device 100. FIG. 1A corresponds to a cross-sectional view taken along the line B1-B2 shown in FIG. 1B, and FIG. 1B corresponds to a cross-sectional view taken along the line A1-A2 shown in FIG. 1A. The semiconductor device 100 of the embodiment can be applied to logic-based and memory-based semiconductor devices in general in which a multilayer wiring structure is used.

The semiconductor device 100 includes a substrate 101, an insulating interlayer 102, a barrier insulating film 106 and an insulating interlayer 108 formed on the substrate 101 in this order, an electrical fuse 150 which is composed of a first wiring 120 formed in the insulating interlayer 108, and has a cutting portion 152, and a second wiring 126 and a third wiring 128, located at the same layer as the first wiring 120, which are respectively formed on both sides of the cutting portion 152 of the first wiring 120 to extend along the cutting portion 152. Here, the first wiring 120 is shown as a first layer wiring (metal 1). However, insofar as the first wiring is a layer in which an insulating interlayer is formed in the upper layer, it may also be formed in another layer.

Here, air gaps 118 formed extending along the cutting portion 152 are respectively provided between the cutting portion 152 of the first wiring 120 and the second wiring 126, and between the cutting portion of the first wiring 120 and the third wiring 128. The air gaps 118 are regions in which the insulating interlayer 108 does not exist. Here, the air gaps 118 function as heat blocking regions having a low thermal conductivity.

The substrate 101 can be, for example, a semiconductor substrate such as a silicon substrate. Although not shown herein, active elements such as a transistor or passive elements such as a capacitor and a resistor, and the like can be formed on the substrate 101.

The first wiring 120, the second wiring 126, and the third wiring 128 are respectively composed of a wiring metal film 124, and a barrier metal film 122 formed in the bottom surface and the lateral surface of the wiring metal film 124. Here, the wiring metal film 124 can be composed of a copper-containing metal film including copper as a major ingredient. In addition, the surface of the copper-containing metal film may be configured such that, for example, a silicide film is formed thereon. The barrier metal film 122 can be composed of, for example, refractory metals such as Ta, TaN, Ti, TiN, W, WN, Ru, and Mn, or a laminated film thereof.

The insulating interlayer 102 can be composed of, for example, phosphorus silicon glass (PSG) or a silicon oxide film. The barrier insulating film 106 can be composed of, for example, SiC, SiCN, SiN, or a laminated film thereof. The insulating interlayer 108 can be composed of a low dielectric constant film having a relative dielectric constant smaller than 3.0. The insulating interlayer 108 can be formed of, for example, porous SiOC ($SiO_xC_yH_z$ having holes) or porous SiO.

In addition, the semiconductor device 100 further includes a guard member 160 formed so as to surround the cutting portion 152 of the first wiring 120. The guard member 160 includes a guard wiring 130 (first guard wiring) and a guard wiring 132 (second guard wiring), located at the same layer as the first wiring 120, which are respectively formed in the outer sides of the second wiring 126 and the third wiring 128 interposed between the cutting portion 152 and the guard wirings (guard wiring 130 and guard wiring 132). Here, the guard wiring 130 and the guard wiring 132 included in the guard member 160 can also be composed of the barrier metal film 122 and the wiring metal film 124, similarly to the first wiring 120 and the like. As shown in FIG. 1A, the guard wiring 130 and the guard wiring 132 can be form in a U-shape. However, insofar as the guard wiring 130 and the guard wiring 132 are configured to cover the periphery of the cutting portion 152, they may be formed in various types of shapes.

By providing such a guard member 160, it is possible to prevent scattered fragments of the metal material forming the first wiring 120 to penetrate into the peripheral insulating interlayer during cutting of the electrical fuse 150. Thereby, it is possible to prevent the defects of malfunction of a circuit due to diffusion of the metal material by a later heat treatment process, or the defects of deterioration of wiring reliability because of infiltration of moisture due to peeling off of the insulating interlayer itself due to an impact at the time of fuse meltdown, and the like.

Figure 2A:
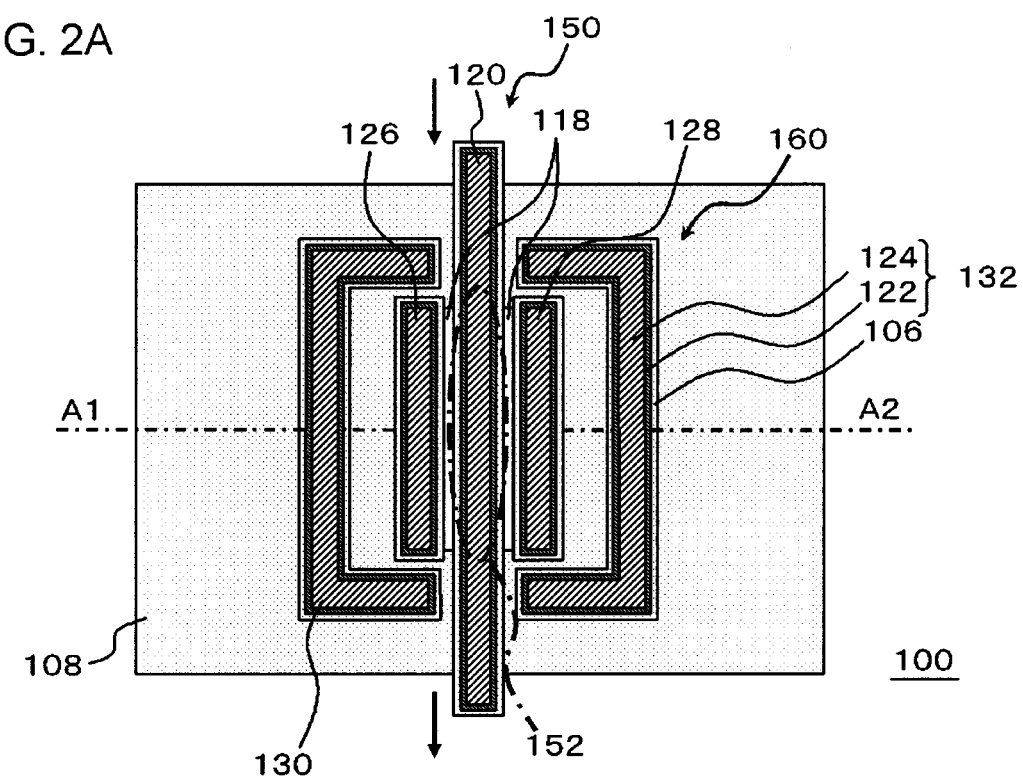
FIGS. 2A and 2B are plan cross-sectional views illustrating the configuration of the semiconductor device shown in FIGS. 1A and 1B.
Figure 2B:
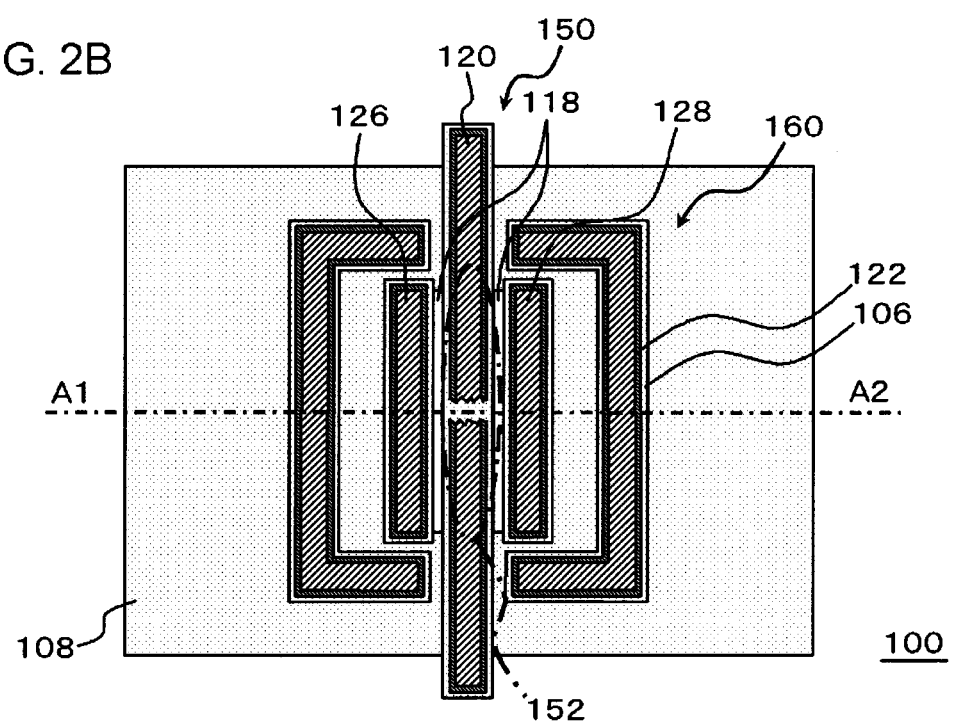

Next, a procedure of cutting the electrical fuse 150 of the semiconductor device 100 according to the embodiment will be described with reference to FIGS. 2A and 2B. FIG. 2A is a plan cross-sectional view illustrating a state before the electrical fuse 150 is cut, and FIG. 2B is a plan cross-sectional view illustrating a state after the electrical fuse 150 is cut. FIGS. 2A and 2B also correspond to cross-sectional views taken along the line B1-B2 shown in FIG. 1B.

In the embodiment, as shown in FIG. 2A, a current is caused to flow into the electrical fuse 150 by applying a predetermined voltage between one end and the other end of the first wiring 120. In the embodiment, the air gaps 118 in which an insulating interlayer does not exist are formed on both sides of the cutting portion 152 of the electrical fuse 150. Here, the thermal conductivity of the air gaps 118 is lower than that of the case where the insulating interlayer exists. Therefore, when a current is caused to flow into the electrical fuse 150, the air gaps 118 function as heat blocking regions, and the heat generation of the cutting portion 152 increases. For this reason, in the cutting portion 152 of the electrical fuse 150, in addition to an effect of electromigration due to the electron flow, the influence of the heat generation increases, and a meltdown is more easily generated, thereby allowing the disconnection to be easily caused. Thereby, as shown in FIG. 2B, the cutting portion 152 of the electrical fuse 150 is melted down and thus the electrical fuse 150 is electrically cut.

Moreover, in the embodiment, the cutting portion 152 of the electrical fuse 150 may have a width equal to or less than the widths of the second wiring 126 and the third wiring 128 in regions in which at least the second wiring 126 and the third wiring 128 are provided. In the example, an example is shown in which the width of the cutting portion 152 is equal to the widths of the second wiring 126 and the third wiring 128. In addition, the widths of the guard wiring 130 and the guard wiring 132 are also equal to the width of the cutting portion 152. As seen from the above, the width of the first wiring 120 is set to be the same as the widths of at least other wirings, so that it is possible to increase, to some extent, a resistance of the cutting portion 152 of the first wiring 120 when a current is caused to flow into the electrical fuse 150, and to facilitate the meltdown of the electrical fuse 150.

Further, in the embodiment, the cutting portion 152 of the electrical fuse 150 is formed in contact with the insulating interlayer 102 formed in the lower layer thereof. That is, the insulating interlayer 102 is formed on the entire surface of the lower layer which is in contact with the cutting portion 152 of the electrical fuse 150, and at least the cutting portion 152 is not provided with a place to connect a via. In a multilayer wiring structure of the semiconductor device, since the via diameter is smaller than the wiring width, the via has a lower resistance than that of the wiring. For this reason, in the case that the wiring forming the electrical fuse is connected to the via, when a current is caused to flow into the electrical fuse, the wiring portion is not cut, but the via is cut. In the embodiment, since the cutting portion 152 of the electrical fuse 150 is not provided with a place to connect a via, and the air gaps 118 are formed on both sides of the cutting portion 152, the cutting portion 152 which is the first wiring 120 can be efficiently cut.

Figure 3A:
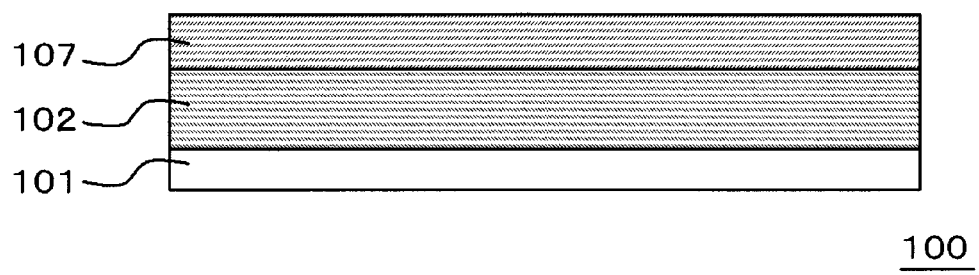
FIGS. 3A and 3B are process cross-sectional views illustrating a manufacturing procedure of the semiconductor device according to the embodiment of the invention.
Figure 3B:
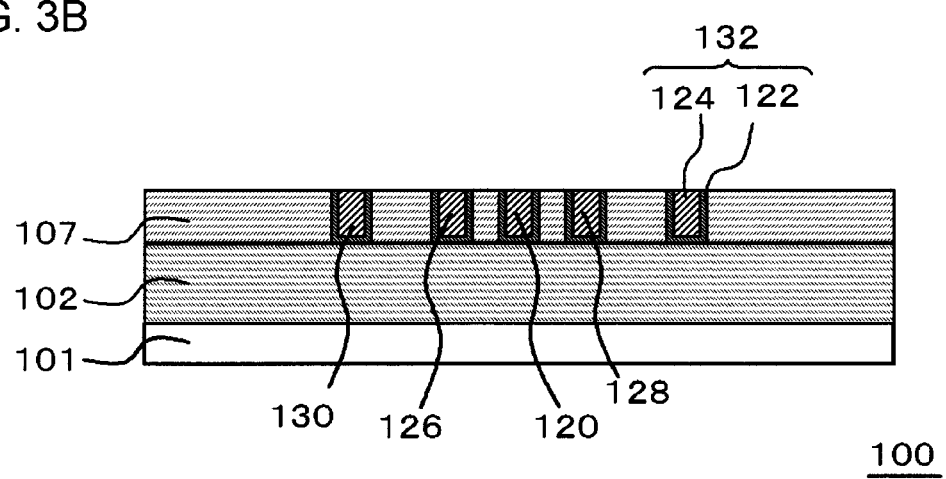
Figure 4:
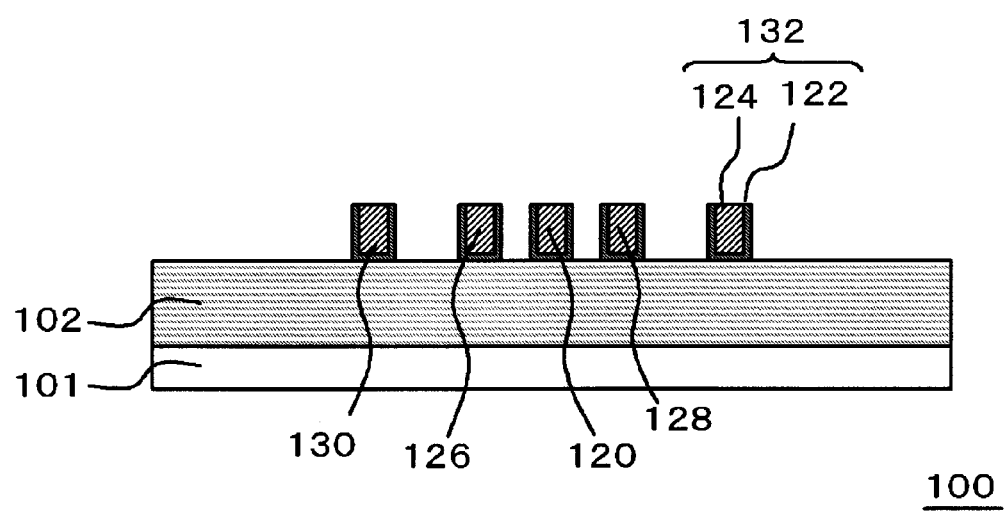
FIG. 4 is a process cross-sectional view illustrating the manufacturing procedure of the semiconductor device according to the embodiment of the invention.

Next, a manufacturing procedure of the semiconductor device 100 according to the embodiment will be described. FIGS. 3A and 3B and FIG. 4 are process cross-sectional views illustrating a manufacturing procedure of the semiconductor device 100.

First, each of the elements is formed on the substrate 101, and the insulating interlayer 102 (having, for example, a film thickness of 200 nm to 800 nm or so) is formed thereon. The insulating interlayer 102 can be formed by, for example, a plasma CVD method. Next, a contact and the like (not shown) electrically connected to the element formed on the substrate 101 are formed in the insulating interlayer 102. In addition, though the insulating interlayer 102 is shown to have one layer, it may be have multiple layers.

Next, an insulating interlayer 107 (having, for example, a film thickness of about 140 nm) is formed on the insulating interlayer 102 (FIG. 3A). The insulating interlayer 107 can be formed of, for example, a low dielectric constant film such as porous SiOCH. Although not shown herein, a cap insulating film having a higher mechanical strength than a low dielectric constant film such as, for example, a silicon oxide film can be formed on the insulating interlayer 107. By forming such a cap insulating film, it is possible to protect the insulating interlayer 107 during chemical mechanical polishing (CMP). After this, a wiring groove is formed in the insulating interlayer 107 (and the cap insulating film) by a lithography process. Subsequently, the barrier metal film 122 (having, for example, a film thickness of 1 nm to 20 nm or so) and the wiring metal film 124 are formed on the insulating interlayer 107 (and the cap insulating film) in this order. The wiring metal film 124 can be formed by, for example, a plating method. Next, the wiring metal film 124 and the barrier metal film 122 which are exposed to the outside of the wiring groove are removed by chemical mechanical polishing. Thereby, as shown in FIG. 3B, the first wiring 120, the second wiring 126, the third wiring 128, the guard wiring 130, and the guard wiring 132 are formed in the insulating interlayer 107.

After this, the insulating interlayer 107 is removed by reactive dry etching (FIG. 4). Thereby, spaces are formed between the first wiring 120 and the second wiring 126, and between the first wiring 120 and the third wiring 128. In addition, although not shown herein, it is possible to form an etching stopper film formed of, for example, SiCN and the like between the insulating interlayer 102 and the insulating interlayer 107, for the purpose of improving selectivity at the time of such etching.

Subsequently, the barrier insulating film 106 (having, for example, a film thickness of 5 nm to 70 nm or so) is formed on the entire surface of the insulating interlayer 102.

Next, the insulating interlayer 108 (having, for example, a film thickness of 140 nm to 200 nm or so) is conformally formed by, for example, a plasma CVD method. The insulating interlayer 108 can be formed of the same material as that of the insulating interlayer 107, but on the other hand it may be formed of a different material. In this case, the insulating interlayer 108 is formed on the condition that the insulating interlayer 108 is not buried in gaps which having a small wiring interval between the first wiring 120 and the second wiring 126, and between the first wiring 120 and the third wiring 128. That is, the insulating interlayer 108 is formed on the condition that the horizontal deposition rate of a film on the shoulder portion of the wiring groove is greater than the deposition rate of a film in the inside of the groove. Thereby, as shown in FIGS. 1A and 1B, the air gaps 118 are respectively formed between the first wiring 120 and the second wiring 126, and between the first wiring 120 and the third wiring 128. In the embodiment, in order to form such air gaps 118, the intervals between the cutting portion 152 of the first wiring 120, and the second wiring 126 and the third wiring 128 are respectively set to the minimum dimensions of the wiring interval of the semiconductor device 100. For example, these intervals can be set to be equal to or less than 70 nm, with respect to a wiring having a pitch of 140 nm.

Figure 5:
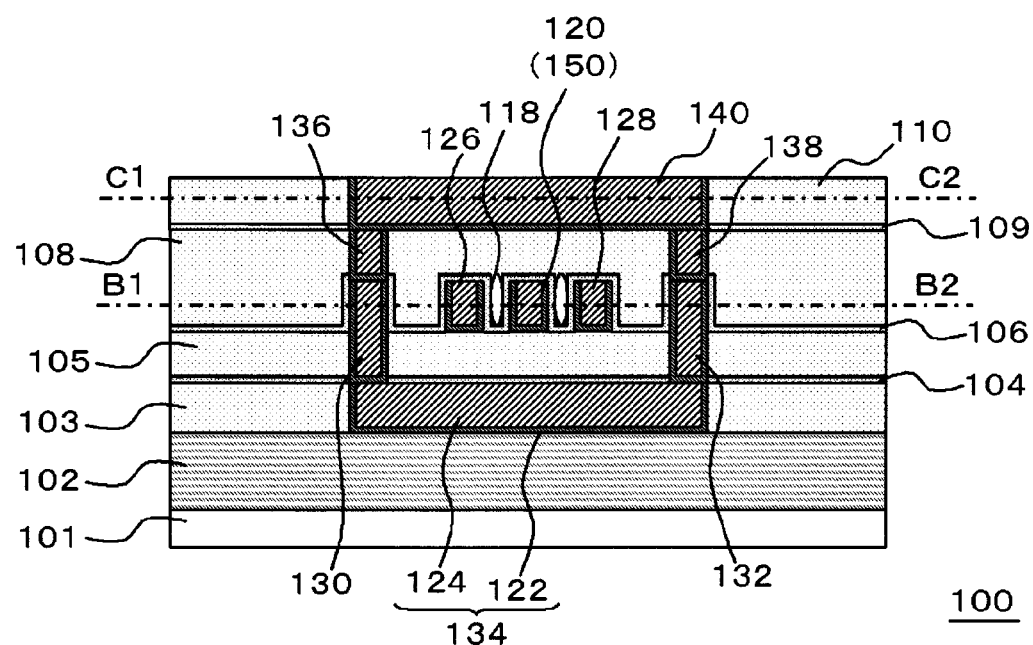
FIG. 5 is a cross-sectional view illustrating another example of the configuration of the semiconductor device according to the embodiment of the invention.

FIG. 5 and FIG. 6 are diagrams illustrating another example of the semiconductor device 100. FIG. 5 is a cross-sectional view of the semiconductor device 100, and FIG. 6 is a plan cross-sectional view of the semiconductor device 100. FIG. 6 corresponds to a cross-sectional view taken along the line C1-C2 shown in FIG. 5, and FIG. 5 corresponds to a cross-sectional view taken along the line A1-A2 shown in FIG. 6. In addition, the cross-sectional view taken along the line B1-B2 shown in FIG. 5 is the same as that of FIG. 1A.

In the example, in addition to the configuration shown in FIG. 1B, the semiconductor device 100 includes an insulating interlayer 103, an etching stopper film 104, and an insulating interlayer 105 which are formed between the insulating interlayer 102 and the barrier insulating film 106 in this order, an etching stopper film 109 and an insulating interlayer 110 which are formed on the insulating interlayer 108 in this order.

In the example, the configuration of the guard member 160 is different from the configuration described with reference to FIGS. 1A and 1B. In the upper layer of the first wiring 120, the guard member 160 further includes an upper electrode 140 formed so as to cover the cutting portion 152 of the electrical fuse 150 when seen in a plan view, a guard via 136 (first guard via), provided in a layer between the guard wiring 130 and the upper electrode 140, for connecting them to each other, and a guard via 138 (second guard via), provided in a layer between the guard wiring 132 and the upper electrode 140, for connecting them to each other. The guard via 136 and the guard via 138 can be a slit via.

The insulating interlayer 108 is formed between the upper electrode 140 and the first wiring 120, and the upper electrode 140 and the first wiring 120 are insulated from each other by the insulating interlayer 108. The guard via 136 and the guard via 138 are formed in the insulating interlayer 108. The upper electrode 140 is formed in the insulating interlayer 110 and the etching stopper film 109. As shown in FIG. 6, in the embodiment, the upper electrode 140 can be formed so as to cover the entirety of the cutting portion 152 of the electrical fuse 150, the second wiring 126, the third wiring 128, the guard wiring 130, and the guard wiring 132 when seen in a plan view.

In the lower layer of the first wiring 120, the guard member 160 can further include a lower electrode 134 formed so as to cover the cutting portion 152 of the electrical fuse 150 when seen in a plan view. The insulating interlayer 105 is formed between the lower electrode 134 and the first wiring 120, and the lower electrode 134 and the first wiring 120 are insulated from each other by the insulating interlayer 105. In the example, the guard wiring 130 and the guard wiring 132 each can be dual-damascene wiring s formed in succession to the vias, and are also formed extending in the insulating interlayer 105 and the etching stopper film 104. That is, the guard wiring 130 and the guard wiring 132 also function as a third guard via and a fourth guard via. Here, the vias of the guard wiring 130 and the guard wiring 132 can be slit vias. The guard wiring 130 and the guard wiring 132 come in contact with the lower electrode 134. The lower electrode 134 can be formed in the same shape as that of the upper electrode 140.

Meanwhile, the lower electrode 134, the guard via 136, the guard via 138, and the upper electrode 140 each can also be formed of the barrier metal film 122 and the wiring metal film 124. The insulating interlayer 103, the insulating interlayer 105, and the insulating interlayer 110 can be formed of the same low dielectric constant film as that of the insulating interlayer 108. The etching stopper film 104 and the etching stopper film 109 can be formed of, for example, SiC, SiCN, SiN, or a laminated film thereof.

In the example, the upper electrode 140 and the lower electrode 134 are respectively formed in the upper layer and the lower layer of the electrical fuse 150. Therefore, even when a metal material forming the electrical fuse 150 is scattered in a vertical direction at the time of cutting the electrical fuse 150, the metal material is blocked by the upper electrode 140 and the lower electrode 134. Accordingly, it is possible to further prevent the metal material from affecting reliability of the semiconductor device 100 by diffusing the metal material in the multilayer wiring structure.

FIG. 7A to FIG. 9 are diagrams illustrating still another example of the semiconductor device 100.

Figure 7A:
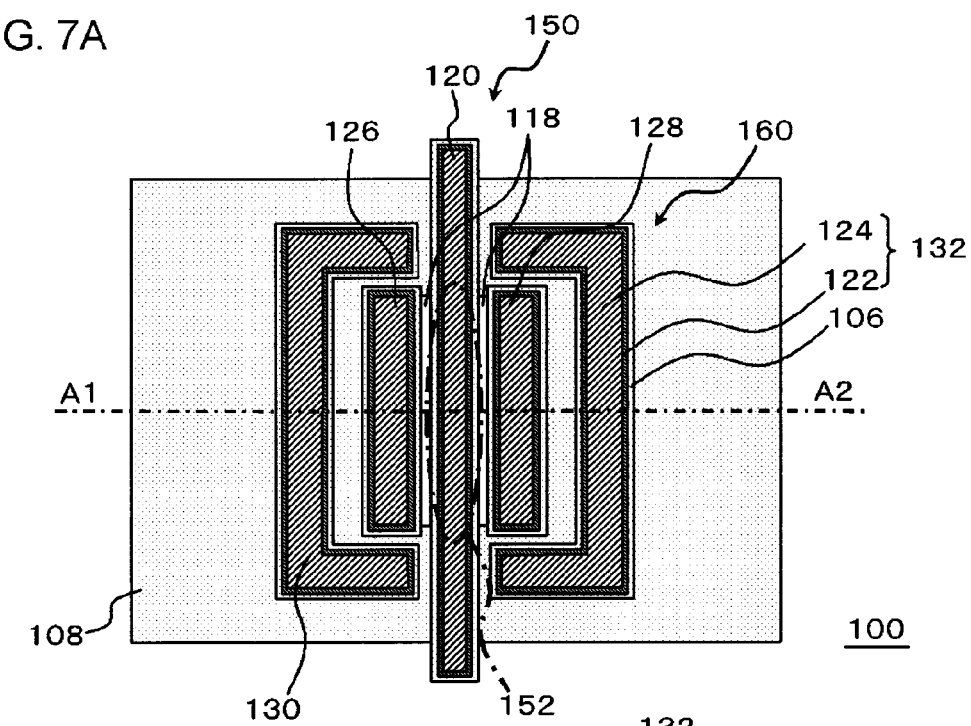
FIGS. 7A and 7B are diagrams illustrating another example of the configuration of the semiconductor device according to the embodiment of the invention.
Figure 7B:
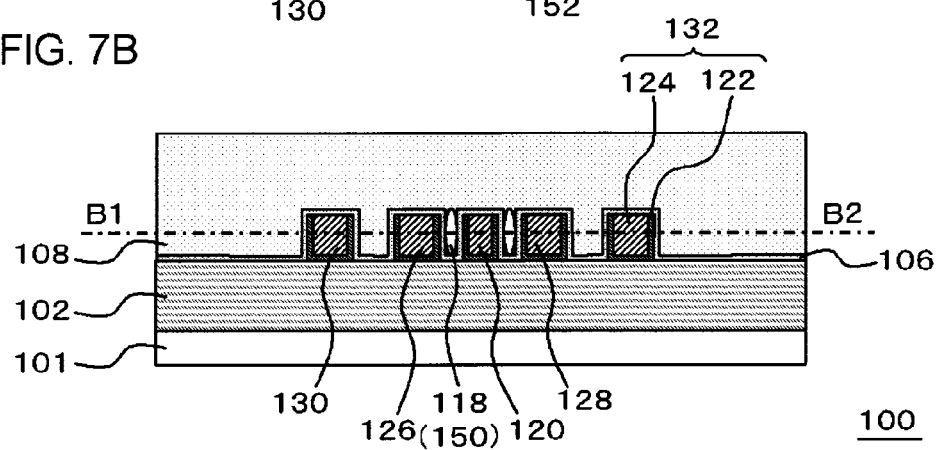

FIG. 7A is a plan cross-sectional view of the semiconductor device 100, and FIG. 7B is a cross-sectional view of the semiconductor device 100. FIG. 7A corresponds to a cross-sectional view taken along the line B1-B2 shown in FIG. 7B, and FIG. 7B corresponds to a cross-sectional view taken along the A1-A2 shown in FIG. 7A.

In an example shown in FIGS. 7A and 7B, the cutting portion 152 of the electrical fuse 150 is formed to have a width smaller than the widths of the second wiring 126 and the third wiring 128 in regions to which at least the second wiring 126 and the third wiring 128 are provided. In addition, the guard wiring 130 and the guard wiring 132 are also formed to have the same width as those of the second wiring 126 and the third wiring 128. That is, herein, only the first wiring 120 forming the electrical fuse 150 is formed to have a small width. According to such a configuration, it is possible to increase a resistance of the cutting portion 152 when a current is caused to flow into the electrical fuse 150, and to facilitate the meltdown of the electrical fuse 150.

FIG. 8 is a plan cross-sectional view of the semiconductor device 100. A cross-sectional view taken along the line A1-A2 shown in FIG. 8 is the same as that of FIG. 1B.

Here, the cutting portion 152 of the electrical fuse 150 is formed to have a width smaller than that of other regions of the first wiring 120. According to such a configuration, it is possible to increase a resistance of the cutting portion 152 when a current is caused to flow into the electrical fuse 150, and to facilitate the meltdown of the electrical fuse 150. Meanwhile, herein, the second wiring 126, the third wiring 128, the guard wiring 130, and the guard wiring 132 are formed to have the same width as that of the cutting portion 152 of the electrical fuse 150.

Figure 9:
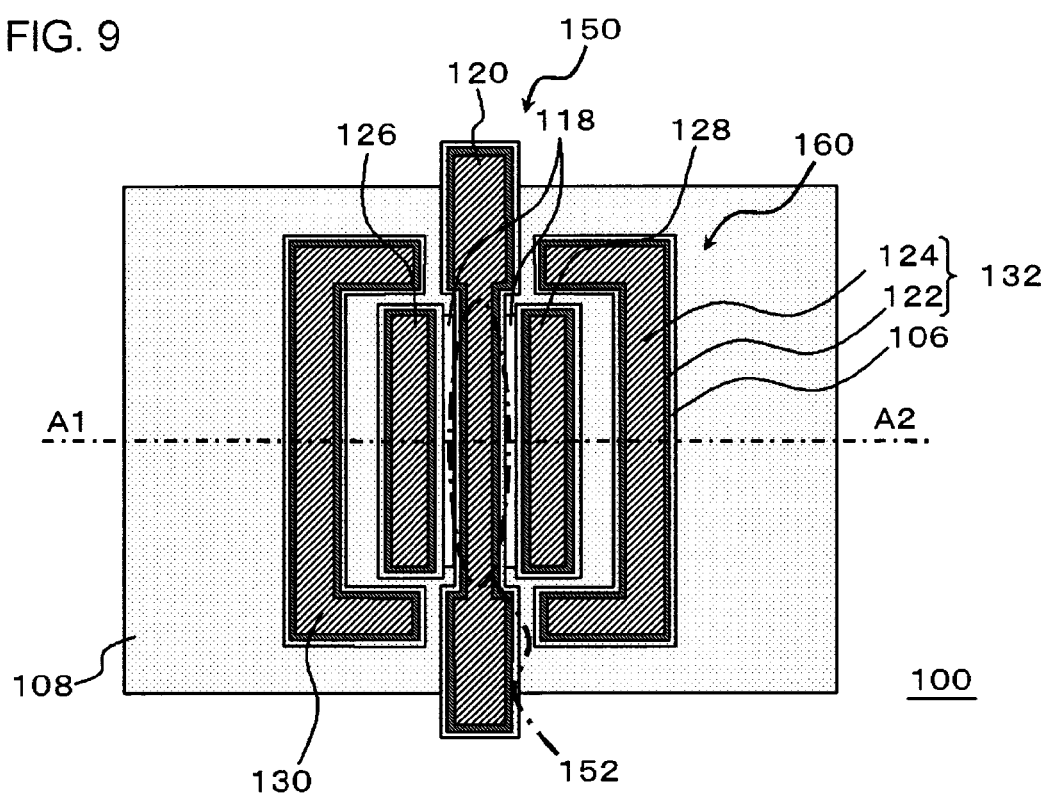
FIG. 9 is a plan cross-sectional view illustrating another example of the configuration of the semiconductor device according to the embodiment of the invention.
Figure 10A:
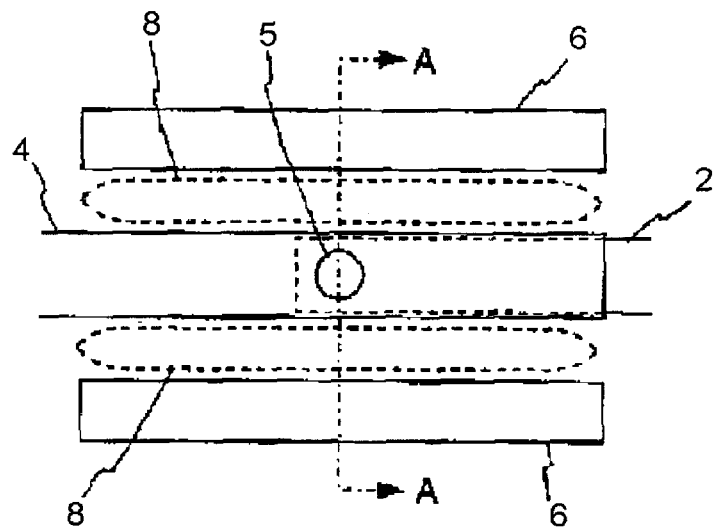
FIGS. 10A and 10B are diagrams illustrating a configuration of a hitherto known semiconductor device.
Figure 10B:
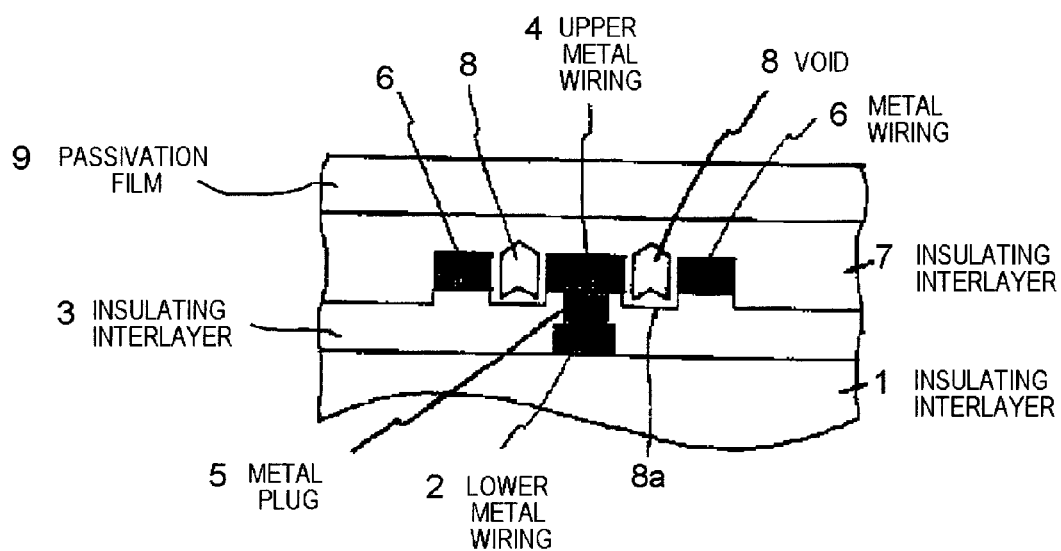
Figure 11A:
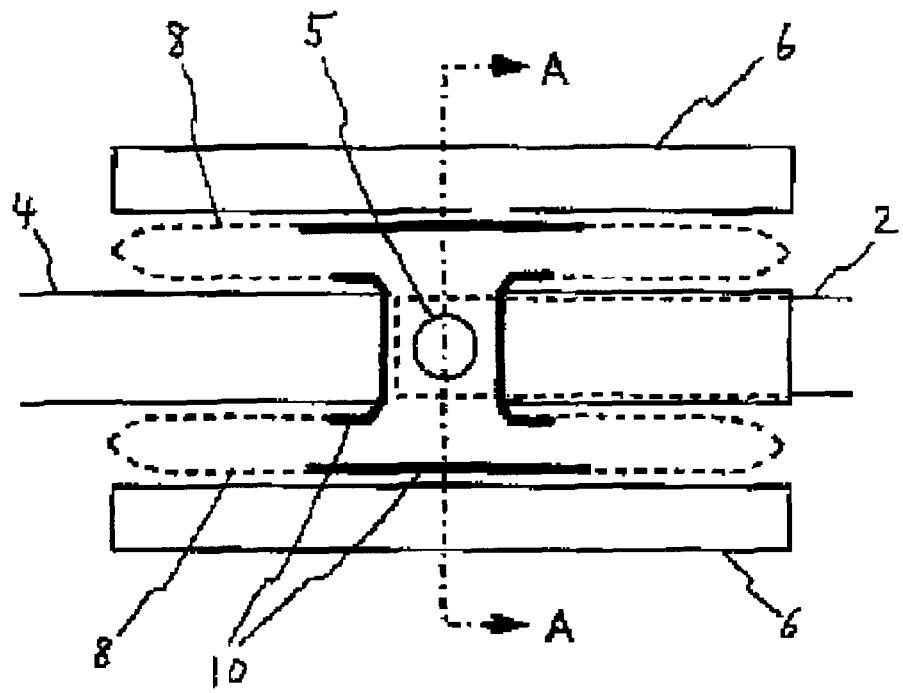
FIGS. 11A and 11B are diagrams illustrating the configuration of the hitherto known semiconductor device.
Figure 11B:
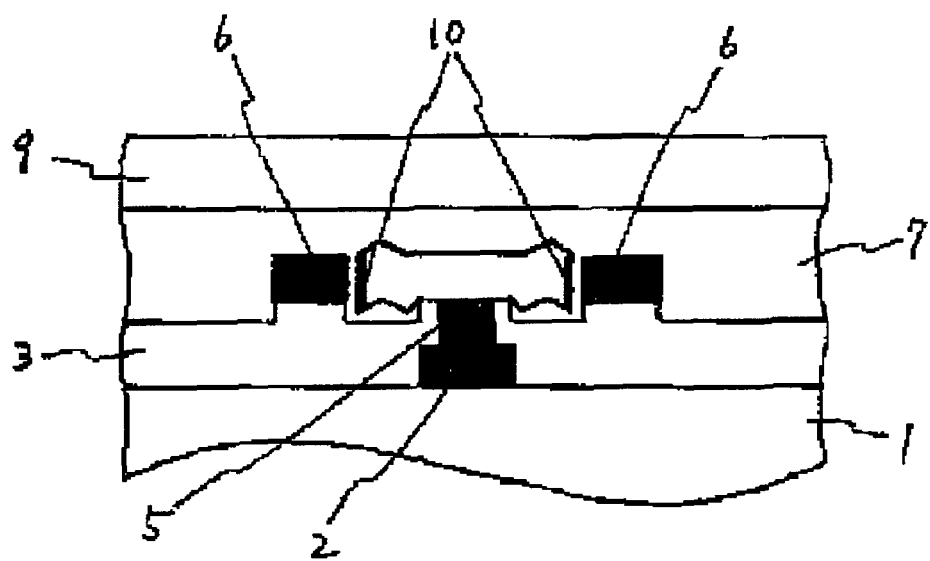

FIG. 9 is a plan cross-sectional view of the semiconductor device 100. A cross-sectional view taken along the line A1-A2 shown in FIG. 9 is the same as that of FIG. 7B.

Here, the cutting portion 152 of the electrical fuse 150 is formed to have a width smaller than those of the second wiring 126 and the third wiring 128 in regions to which at least the second wiring 126 and the third wiring 128 are provided. In addition, the cutting portion 152 of the electrical fuse 150 is formed to have a width smaller than that of other regions of the first wiring 120. In addition, herein, the guard wiring 130 and the guard wiring 132 are formed to have the same width as those of the second wiring 126 and the third wiring 128. That is, herein, only the cutting portion 152 of the first wiring 120 forming the electrical fuse 150 is formed to have a small width. Meanwhile, regions other than the cutting portion 152 of the first wiring 120 may have the same widths as the widths of the second wiring 126 and the third wiring 128, and may have widths different from those. According to such a configuration, it is possible to increase a resistance of the cutting portion 152 when a current is caused to flow into the electrical fuse 150, and to facilitate the meltdown of the electrical fuse 150.

Next, the effect of the semiconductor device 100 in the embodiment will be described.

According to the semiconductor device 100 in the above-mentioned embodiment, an insulating interlayer does not exist in both sides of the cutting portion 152 of the electrical fuse 150, and the air gaps 118 having a lower thermal conductivity than the insulating interlayer are provided therein. For this reason, when the electrical fuse 150 is cut by causing a current to flow into the electrical fuse 150, the air gaps 118 function as a heat blocking region. Thereby, it is possible to reduce heat dissipation from the cutting portion 152, to cause the cutting portion 152 to effectively generate heat, and to easily perform the meltdown of the electrical fuse 150.

Moreover, in the above-mentioned embodiment, the cutting portion 152 of the electrical fuse 150 is formed in contact with the insulating interlayer 102 formed in the lower layer thereof. For this reason, it is possible to efficiently cut the cutting portion 152 which is the first wiring 120. On the other hand, for example, with respect to a fuse having a configuration disclosed in Japanese Unexamined Patent Publication No. H11-97542, an upper metal wiring 4 is connected to a metal plug 5. For this reason, in the case that this fuse is used as an electrical fuse, when a current is caused to flow into the fuse, the upper metal wiring 4 is not cut, but a metal plug 5 (via) is cut.

As described above, although the embodiments of the invention have been set forth with reference to the drawings, they are merely illustrative of the invention, and various configurations other than those stated above can be adopted.

Meanwhile, in the above-mentioned embodiments, as shown in FIG. 4, an example is shown in which the insulating interlayer 107 is removed on the entire surface of the substrate 101. However, insofar as the insulating interlayer 107 is removed to such an extent that spaces are provided between the first wiring 120 and the second wiring 126 and between the first wiring 120 and the third wiring 128, a portion thereof may remain. In this case, the insulating interlayer 107 can be formed of the same material as that of the insulating interlayer 108.

Moreover, in the above-mentioned embodiment, the example shown in FIGS. 1A and 1B are also illustrated in which the semiconductor device 100 has the guard member 160 including the guard wiring 130 and the guard wiring 132. However, the semiconductor device 100 can be configured not to have the guard member 160. Further, in the example described with reference to FIGS. 5 and 6, the configuration is shown in which the upper electrode 140 is connected to the guard wiring 130 and the guard wiring 132, respectively, through the guard via 136 and the guard via 138. However, the upper electrode 140 can be configured to be connected to the second wiring 126 and the third wiring 128 through the guard vias, using a configuration in which the semiconductor device 100 does not include the guard wiring 130 and the guard wiring 132.

Further, in the configuration described with reference to FIG. 7A to FIG. 9, the guard member 160 having the configuration shown in FIGS. 5 and 6 can also be provided. Moreover, in this case, the upper electrode 140 can also be configured to be connected to the second wiring 126 and the third wiring 128 through the guard vias, using a configuration in which the semiconductor device 100 does not include the guard wiring 130 and the guard wiring 132.

It is apparent that the present invention is not limited to the above embodiment, and may be modified and changed without departing from the scope and spirit of the invention.

What is claimed is:

1. A semiconductor device comprising:
a substrate;
an insulating interlayer formed over said substrate,
an electrical fuse which is composed of a first wiring formed in said insulating interlayer, and has a cutting portion; and
a second wiring and a third wiring, formed respectively on both sides of said cutting portion to extend along said cutting portion in the same layer as said first wiring,
wherein air gaps formed to extend along said cutting portion are respectively provided between said cutting portion and said second wiring and between said cutting portion and said third wiring.

2. The semiconductor device as set forth in claim 1, further comprising a guard member which includes, in the upper layer of said first wiring, an upper electrode formed so as to cover said cutting portion when seen in a plan view.

3. The semiconductor device as set forth in claim 2, wherein said guard member further includes a first guard wiring and a second guard wiring which are respectively formed in the outer side of said second wiring and said third wiring interposed between said cutting portion and said guard wirings, and located in the same layer as said first interconnect, a first guard via which is provided in a layer between said first guard wiring and said upper electrode for connecting said first guard wiring and said upper electrode, and a second guard via which is provided in a layer between said second guard wiring and said upper electrode for connecting said second guard wiring and said upper electrode.

4. The semiconductor device as set forth in claim 3, wherein said guard member further includes a lower electrode formed so as to cover said cutting portion when seen in a plan view in the lower layer of said first wiring, a third guard via which is provided in a layer between said first guard wiring and said lower electrode for connecting said first guard wiring and said lower electrode, and a fourth guard via which is provided in a layer between said second guard wiring and said lower electrode for connecting said guard wiring and said lower electrode.

5. The semiconductor device as set forth in claim 1, wherein said cutting portion has a width equal to or less than widths of said second wiring and said third wiring in regions to which at least said second wiring and said third wiring are provided.

6. The semiconductor device as set forth in claim 1, wherein said cutting portion has a width smaller than widths of said second wiring and said third wiring in regions to which at least said second wiring and said third wiring are provided.

7. The semiconductor device as set forth in claim 1, wherein said cutting portion is formed to have a width smaller than widths of other regions of said first wiring.

8. The semiconductor device as set forth in claim 1, wherein the intervals between said cutting portion, and said second wiring and said third wiring have the minimum dimension of the wiring intervals of the semiconductor device.

9. The semiconductor device as set forth in claim 1, wherein said cutting portion is formed in contact with an insulating film formed in the lower layer thereof.

10. The semiconductor device as set forth in claim 1, said first wiring, said second wiring, and said third wiring are formed of a copper-containing metal film including copper as a major ingredient.

* * * * *